(12) United States Patent
Xu et al.

(10) Patent No.: US 9,888,590 B2
(45) Date of Patent: Feb. 6, 2018

(54) PRINTED CIRCUIT BOARD, DISPLAY PANEL AND WIRING METHOD FOR PRINTED CIRCUIT BOARD

(71) Applicants: BOE Technology Group Co., Ltd., Beijing (CN); Chongqing BOE Optoelectronics Technology Co., Ltd., Chongqing (CN)

(72) Inventors: Zhuo Xu, Beijing (CN); Yajie Bai, Beijing (CN); Xiaoyuan Wang, Beijing (CN); Jaikwang Kim, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/519,579
(22) PCT Filed: Aug. 19, 2016
(86) PCT No.: PCT/CN2016/095992
§ 371 (c)(1),
(2) Date: Apr. 17, 2017
(87) PCT Pub. No.: WO2017/067308
PCT Pub. Date: Apr. 27, 2017

(65) Prior Publication Data
US 2017/0257957 A1    Sep. 7, 2017

(30) Foreign Application Priority Data
Oct. 23, 2015   (CN) .......................... 2015 1 0698559

(51) Int. Cl.
*H05K 1/00*     (2006.01)
*H05K 5/00*     (2006.01)
(Continued)

(52) U.S. Cl.
CPC ........... *H05K 5/0017* (2013.01); *H01R 12/55* (2013.01); *H01R 12/7076* (2013.01);
(Continued)

(58) Field of Classification Search
CPC ................. H05K 5/0017; H05K 1/181; H05K 2201/09227; H05K 2201/10128; H01R 12/55; H01R 12/7076
(Continued)

(56) References Cited

U.S. PATENT DOCUMENTS

2013/0021760 A1    1/2013  Kim et al.

FOREIGN PATENT DOCUMENTS

| CN | 101369479 A | 2/2009 |
|---|---|---|
| CN | 103309107 A | 9/2013 |

(Continued)

OTHER PUBLICATIONS

First Office Action from Chinese Patent Application No. 201510698559.0, dated Aug. 22, 2017, 6 pages.
(Continued)

*Primary Examiner* — Tremesha S Willis
(74) *Attorney, Agent, or Firm* — Westman, Champlin & Koehler, P.A.

(57) ABSTRACT

A printed circuit board, a display panel and a wiring method are provided by embodiments of the disclosure. The printed circuit board includes: a first multichannel circuit connecting terminal; a second multichannel circuit connecting terminal; and a plurality of connecting wires connecting a plurality of second channel connecting pins of the second multichannel circuit connecting terminal with a part of a first channel connecting pins of the first multichannel circuit connecting terminal in one-to-one correspondence, the rest of the first channel connecting pins being spare, where at least one of the plurality of connecting wires has a first portion, which is bent to extend through a spare region, on the printed circuit board, between the spare first channel connecting pins and the second multichannel circuit connecting terminal.

20 Claims, 4 Drawing Sheets

(51) Int. Cl.
   *H01R 12/70* (2011.01)
   *H01R 12/55* (2011.01)
   *H05K 1/18* (2006.01)

(52) U.S. Cl.
   CPC ... *H05K 1/181* (2013.01); *H05K 2201/09227* (2013.01); *H05K 2201/10128* (2013.01)

(58) Field of Classification Search
   USPC ..... 361/679.01, 679.02, 728, 736, 748, 760, 361/761, 772–774, 777
   See application file for complete search history.

(56) References Cited

FOREIGN PATENT DOCUMENTS

| | | | |
|---|---|---|---|
| CN | 104349578 A | | 2/2015 |
| CN | 105188259 A | | 12/2015 |
| JP | 2006100301 A | * | 4/2006 |
| JP | 2011-204457 A | | 10/2011 |
| KR | 20040107744 A | | 12/2004 |

OTHER PUBLICATIONS

International Search Report and Written Opinion of International Application No. PCT/CN2016/095992, dated Nov. 28, 2016, 21 pages.

* cited by examiner

PRINTED CIRCUIT BOARD, DISPLAY PANEL AND WIRING METHOD FOR PRINTED CIRCUIT BOARD

CROSS-REFERENCE TO RELATED APPLICATION

This application is a Section 371 National Stage Application of International Application No. PCT/CN2016/095992, filed on 19 Aug. 2016, entitled "Printed Circuit Board, Display Panel and Wiring Method for the Printed Circuit Board", which claims priority to Chinese Application No. 201510698559.0, filed on 23 Oct. 2015, incorporated herein by reference in their entirety.

TECHNICAL FIELD

The present disclosure relates to the field of printed circuit boards, and specially, to a printed circuit board, a display panel and a wiring method for the printed circuit board.

BACKGROUND

Wiring of a printed circuit board has a significant influence on quality of signals of a circuit. For example, differences in resistance among connecting wires (also known as fan-out lines) between two multichannel connecting terminals may leads to different signal delays. In applications of display panels, for example, if such differences in resistance of connecting wires between an integrated circuit connecting terminal and a display region connecting terminal of a display panel is too large, a split screen phenomenon or a non-uniform display may occur. Generally, connecting wires are not configured as straight lines in a point-to-point connection manner, but are bent to achieve a minimum resistance difference and a minimum space while ensuring suitable wire widths and wire distances required by processes. In current products, most wiring is achieved by using wiring tools, and final performance of the wiring depends on calculating method and wiring method implemented by the wiring tools. Existing wiring techniques are based on a condition that the number of channels of an integrated circuit connecting terminal is the same as the number of channels of a display region of a display panel.

SUMMARY

An object of the present disclosure is to provide a printed circuit board and a display panel having the printed circuit board, which may save space required for wiring and/or reduce resistance differences among connecting wires in the case of two multichannel circuit connecting terminals having different numbers of channels.

The present disclosure further discloses a wiring method for the printed circuit board.

Technical solutions of the present disclosure are disclosed as follows to achieve the above object.

According to an embodiment of the present disclosure, there is provided a printed circuit board including:

a first multichannel circuit connecting terminal having a plurality of first channel connecting pins;

a second multichannel circuit connecting terminal having a plurality of second channel connecting pins, the plurality of second channel connecting pins being arranged to face the plurality of first channel connecting pins, the number of the first channel connecting pins being larger than the number of the second channel connecting pins and a length of the second multichannel circuit connecting terminal being larger than a length of the first multichannel circuit connecting terminal; and a plurality of connecting wires arranged between the first multichannel circuit connecting terminal and the second multichannel circuit connecting terminal, the plurality of connecting wires connecting the plurality of second channel connecting pins with a part of the first channel connecting pins in one-to-one correspondence, with the rest of the first channel connecting pins being spare, where at least one of the plurality of connecting wires has a first portion, which is bent to extend through a spare region, on the printed circuit board, between the spare first channel connecting pins and the second multichannel circuit connecting terminal.

In an embodiment, the spare first channel connecting pins may be located at a central position of the plurality of first channel connecting pins.

In an embodiment, the at least one of the connecting wires may include a shortest connecting wire.

In an embodiment, the at least one of the connecting wires may further include a connecting wire located adjacent to the shortest connecting wire and having a first portion bent towards the shortest connecting wire.

In an embodiment, the plurality of connecting wires may be arranged symmetrically about the shortest connecting wire.

In an embodiment, the first portion may include a plurality of bend portions in the spare region.

In an embodiment, the first portion may be arranged in a bow-shaped manner or a zig-zag manner in the spare region.

In an embodiment, the plurality of connecting wires may be arranged in a same wiring layer.

In an embodiment, the at least one of the connecting wires may further include:

a second portion connected between a corresponding one of the first channel connecting pins and the first portion; and a third portion extending from the first portion towards a corresponding one of the second channel connecting pins.

In an embodiment, the first multichannel circuit connecting terminal may be an integrated circuit connecting terminal, and the second multichannel circuit connecting terminal may be a display region connecting terminal of a display panel.

According to another embodiment of the present disclosure, there is provided a display panel including the printed circuit board according to any one of the above embodiments.

According to a further embodiment of the present disclosure, there is provided a wiring method for a printed circuit board, the printed circuit board including a first multichannel circuit connecting terminal having a plurality of first channel connecting pins and a second multichannel circuit connecting terminal having a plurality of second channel connecting pins, the plurality of second channel connecting pins being arranged to face the plurality of first channel connecting pins, the number of the first channel connecting pins being larger than the number of the second channel connecting pins, and a length of the second multichannel circuit connecting terminal being larger than a length of the first multichannel circuit connecting terminal, the wiring method including the following steps of:

(a) determining a spare first channel connecting pin of the plurality of first channel connecting pins and arranging a first connecting wire to connect a first one of the plurality of second channel connecting pins with a corresponding non-spare one of the first channel connecting pins, the first connecting wire being bent to pass through a spare region, on the printed circuit board, between the spare first channel connecting pin and the second multichannel circuit connecting terminal; and (b) arranging other connecting wires at both sides of the first connecting wire to connect other second channel connecting pins at both sides of the first one of the plurality of second channel connecting pins with other non-spare first channel connecting pins respectively.

In an embodiment, the first connecting wire is a shortest connecting wire.

In an embodiment, the spare first channel connecting pin is located at a central position of the first multichannel circuit connecting terminal, the first one of the second channel connecting pins faces the spare first channel connecting pin of the first multichannel circuit connecting terminal, and wherein the step (a) may include:

arranging a first segment of the first connecting wire from the first one of the second channel connecting pin towards the first multichannel circuit connecting terminal in a direction perpendicular to a plane of the first multichannel circuit connecting terminal to a first node, the first node being located between the first one of the second channel connecting pins and the spare first channel connecting pin; and arranging a second segment of the connecting wire from the first node to the non-spare first channel connecting pins, wherein an extending direction of the second segment is not parallel to or does not coincide with an extending direction of the first segment.

In an embodiment, the step (b) may include:

arranging a first segment of a second connecting wire such that it extends from an adjacent second one of the second channel connecting pins located at a first side of the first one of the second channel connecting pins towards the first segment of the first connecting wire to a second node, the second node being located between the second one of the second channel connecting pins and the first segment of the first connecting wire;

arranging a second segment of the second connecting wire such that it extends from the second node in a direction in parallel with the first segment of the first connecting wire to a third node, the third node being located between the second node and the first multichannel circuit connecting terminal;

arranging a third segment of the second connecting wire such that it extends from the third node to a fourth node, the fourth node being located between the first multichannel circuit connecting terminal and the second multichannel circuit connecting terminal, at a position directly facing another first channel connecting pin at the first side of the non-spare first channel connecting pin and being closer to the first multichannel circuit connecting terminal than the third node; and arranging a fourth segment of the second connecting wire such that it extends from the fourth node to the another first channel connecting pin.

In an embodiment, the step (b) may further include:

arranging a first segment of a third connecting wire such that it extends from a third one of the second channel connecting pins located at an outer side of the second one of the second channel connecting pins towards the second segment of the second connecting wire to a fifth node, the fifth node being located between the third one of the second channel connecting pins and the second segment of the second connecting wire;

arranging a second segment of the third connecting wire such that it extends from the fifth node to a sixth node, the sixth node being located between the first multichannel circuit connecting terminal and the second multichannel circuit connecting terminal, at a position directly facing a further first channel connecting pin at an outer side of the another first channel connecting pin and being closer to the first multichannel circuit connecting terminal than the fifth node; and arranging a third segment of the third connecting wire such that it extends from the sixth node to the further first channel connecting pin.

In an embodiment, a plurality of the second connecting wires may be arranged between the first connecting wire and the third connecting wire, and lengths of the second segments of the plurality of second connecting wires gradually decrease along a direction from the first connecting wire towards the third connecting wire.

In an embodiment, a connecting wire located adjacent to the first connecting wire may be bent towards the first connecting wire.

In an embodiment, all the connecting wires may be arranged symmetrically about the first connecting wire.

In an embodiment, the first connecting wire may be bent several times in the spare region.

In an embodiment, all the connecting wires may be arranged in a same wiring layer.

With any one of the embodiments set forth above, coefficient of utilization of wiring space between the first multichannel circuit connecting terminal and the second multichannel circuit connecting terminal is improved. It is desirable that the difference in resistances of at least some of the connecting wires may be reduced. In the case that the printed circuit board according to an embodiment of the disclosure is used in a display panel, non-uniform display caused by difference in resistances of connecting wires may be alleviated.

BRIEF DESCRIPTION OF THE DRAWINGS

FIG. 1b shows an exemplary basic line type for connecting wires in the wiring shown in FIG. 1a;

FIG. 2b is a partial enlarged view of FIG. 2a;

FIG. 2c shows an exemplary basic line type for connecting wires in the wiring shown in FIG. 2a; and FIG. 3 illustratively shows each segment of a connecting wire and nodes used in a wiring method according to embodiment of the present disclosure, which corresponds to the printed circuit board shown in FIG. 2a.

DETAILED DESCRIPTION OF PREFERRED EMBODIMENTS

The present disclosure will be described hereinafter in embodiments with reference to the attached drawings, where the like reference numerals refer to the like elements. The embodiments described with reference to the drawings aim to provide an explanation of a general concept of the present disclosure, and should not be construed as limitations to the present disclosure.

According to a general concept of the present disclosure, there is provided a printed circuit board, which includes: a first multichannel circuit connecting terminal having a plurality of first channel connecting pins; a second multichannel circuit connecting terminal having a plurality of second channel connecting pins, the plurality of second channel connecting pins facing the plurality of first channel connecting pins, the number of the first channel connecting pins being larger than the number of the second channel connecting pins and a length of the second multichannel circuit connecting terminal being larger than a length of the first multichannel circuit connecting terminal; and a plurality of connecting wires disposed between the first multichannel circuit connecting terminal and the second multichannel circuit connecting terminal, the plurality of connecting wires connecting the plurality of second channel connecting pins with a part of the first channel connecting pins in one-to-one correspondence and the rest of the first channel connecting pins being spare, where at least one of the plurality of connecting wires has a first portion, which is bent and extends through a region (hereinafter, "spare region" for short) on the printed circuit board and between the spare first channel connecting pins and the second multichannel circuit connecting terminal.

Moreover, in the following detailed description, many specific details are set forth such that a fully understanding of the embodiments of the present disclosure may be achieved. Obviously, however, one or more embodiments may be implemented without these details.

Figure 1A:
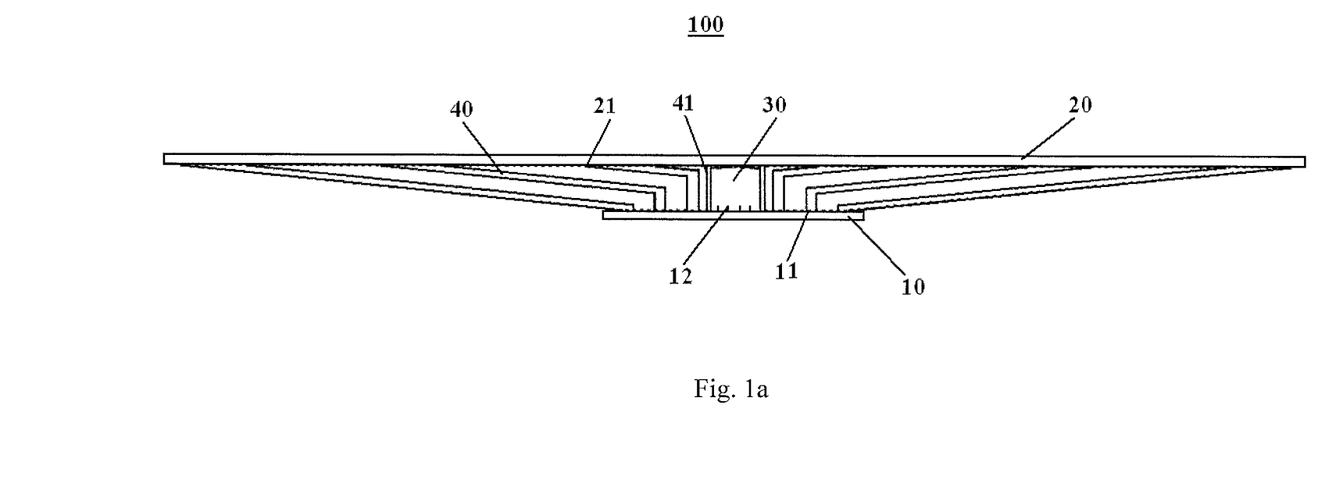
FIG. 1a shows an exemplary wiring of connecting wires between two multichannel circuit connecting terminals on a printed circuit board.

In wiring design of a printed circuit board 100, wiring between two multichannel circuit connecting terminals is commonly concerned. If one of the multichannel circuit connecting terminals has more channels than the other, a part of connecting pins of the former connecting terminal are spare, as shown in FIG. 1a. In FIG. 1a, the number of channels of the first multichannel circuit connecting terminal 10 is larger than the number of channels of the second multichannel circuit connecting terminal 20. Thus, the first multichannel circuit connecting terminal 10 has spare connecting pins 12 (i.e., the connecting pins that are not connected with connecting wires 40). In FIG. 1a, these spare connecting pins are shown at a central position of the first multichannel circuit connecting terminal 10, and a spare region 30, through which no connecting wire passes, is formed between the spare connecting pins and the second multichannel circuit connecting terminal 20. Arranging the spare connecting pins at the central position of the first multichannel circuit connecting terminal 10 may reduce a wiring space in a direction perpendicular to the planes of the two multichannel circuit connecting terminals (i.e., the vertical direction shown in FIG. 1a). However, this is not necessary. For example, the spare connecting pins may also be arranged at positions towards both sides of the first multichannel circuit connecting terminal 10.

Figure 1B:
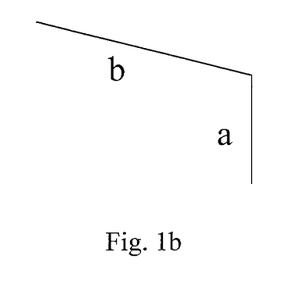

In the example shown in FIG. 1a, the connecting wires 40 are arranged and configured in a basic line type which mainly has two segments. As shown in FIG. 1b, most of connecting wires 40 are composed of two line segments a, b which are connected with one another end to end. Line segment a is a straight line segment extending, in a vertical direction of FIG. 1, from a connecting pin of the first multichannel circuit connecting terminal 10 towards the second multichannel circuit connecting terminal 20, which may facilitate a connection with the connecting pin of the first multichannel circuit connecting terminal 10. Line segment b is an inclined line segment extending towards a corresponding connecting pin of the second multichannel circuit connecting terminal 20. The configuration of the inclined line segment may save wiring space, and therefore, it may sometimes be named as a "space compressing portion" of the connecting wire 40. For a connecting pins located at a central position of the first multichannel circuit connecting terminal 10, only the line segment is provided to connect corresponding connecting pins of the first multichannel circuit connecting terminal 10 to those of the second multichannel circuit connecting terminal 20 directly without the line segment b. A connecting wire only has the line segment a is the connecting wire 41 having a minimum length ("shortest connecting wire" for short). For connecting wires at both sides of the shortest connecting wire 41, lengths of line segments a gradually decrease and lengths of line segments b gradually increases until the outmost end of the first multichannel circuit connecting terminal 10. With the existence of the spare connecting pins of the first multichannel circuit connecting terminal 10, this type of wiring may result in a spare region 30 between the spare connecting pins and the second multichannel circuit connecting terminal 20, as mentioned above. To be noted, the line segment b may be directly connected with a corresponding connecting pin of the second multichannel circuit connecting terminal 20, or it may be connected with the corresponding connecting pin of the second multichannel circuit connecting terminal 20 by an additional straight segment so as to facilitate the wiring of the connecting wires.

Figure 2A:
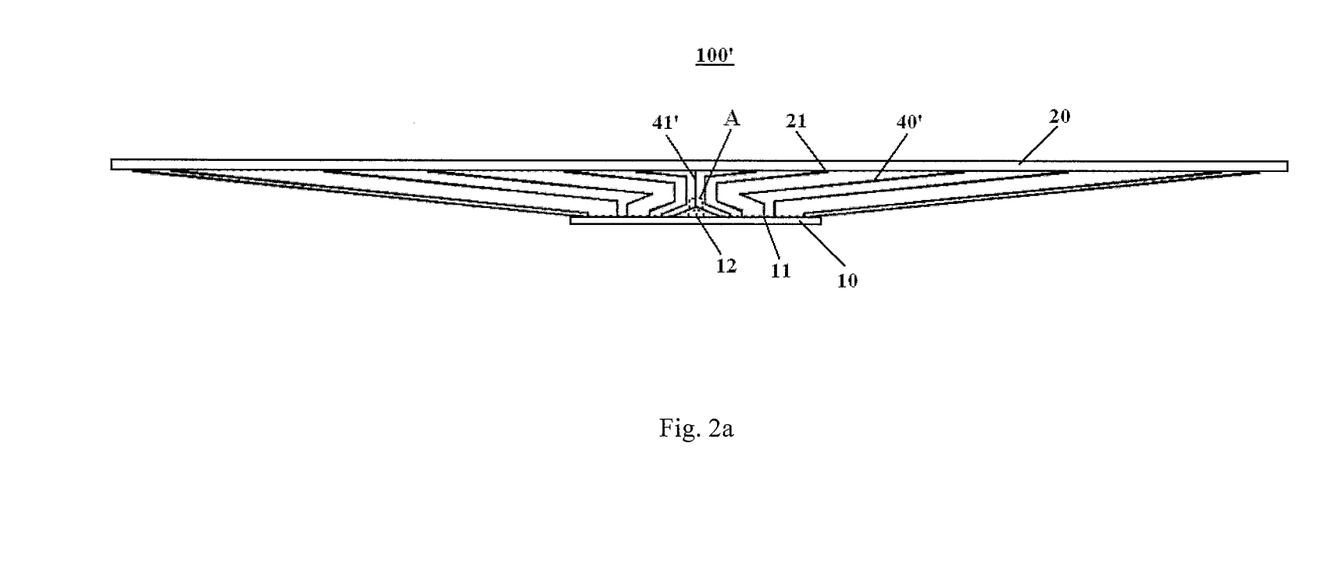
FIG. 2a illustratively shows a wiring structure between two multichannel circuit connecting terminals of a printed circuit board according to an embodiment of the present disclosure.
Figures 2B, 2C:
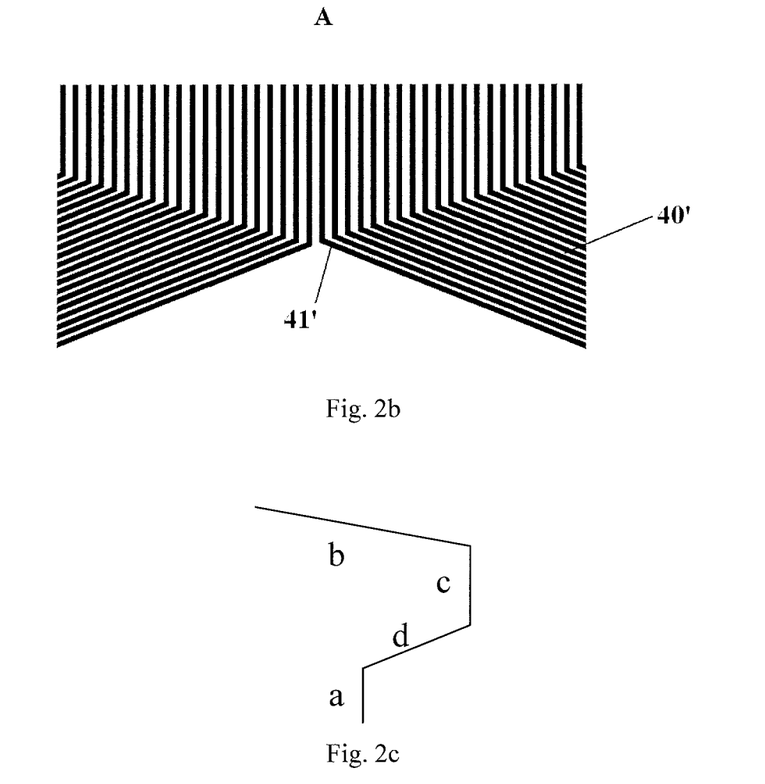

FIGS. 2a and 2b show a wiring structure for connecting wires between two multichannel circuit connecting terminals of a printed circuit board according to an embodiment of the present disclosure. The printed circuit board 100' includes a first multichannel circuit connecting terminal 10 and a second multichannel circuit connecting terminal 20. The first multichannel circuit connecting terminal 10 has a plurality of first channel connecting pins 11. The second multichannel circuit connecting terminal 20 has a plurality of second channel connecting pins 21. The plurality of second channel connecting pins 21 are arranged to face the plurality of first channel connecting pins 11, and the number of the first channel connecting pins 11 is larger than the number of the second channel connecting pins 21 and a length of the second multichannel circuit connecting terminal 20 is larger than a length of the first multichannel circuit connecting terminal 10.

The printed circuit board 100' further includes a plurality of connecting wires 40' arranged between the first multichannel circuit connecting terminal 10 and the second multichannel circuit connecting terminal 20, and the plurality of connecting wires 40' connect the plurality of second channel connecting pins 21 with a part of the first channel connecting pins 11 in one-to-one correspondence, thus, the rest first channel connecting pins of the first multichannel circuit connecting terminal 10 other than the part of the first channel connecting pins are spare.

In the embodiment, at least part of the plurality of connecting wire 40' may have a portion (which can be termed as the first portion of the connecting wire) that is bent and extends through a region (i.e., the "spare region"), between the spare first channel connecting pins 12 and the second multichannel circuit connecting terminal 20, on the printed circuit board 100'. The configuration of the first portion of the connecting wire may be favor of increasing utilization of space, and therefore it may be called as a space utilizing portion.

To be noted, to make the drawings more clear, FIG. 2a only illustratively shows several connecting wires 40', which in practice may be more and dense. FIG. 2b is a partial enlarged view of portion A of FIG. 2a, where more dense connecting wires are shown, and especially, bend of the shortest connecting wire 41' is shown.

In the example shown in FIGS. 1a and b, the region between the spare first channel connecting pins 12 and the second multichannel circuit connecting terminal 20 is a spare region, that is to say, the connecting wire 41 is not bent and extends through this spare region. However, in the embodiment shown in FIGS. 2a and 2b, wiring of the connecting wires has utilized the spare region, so that utilization of space has been improved.

During wiring of the connecting wires, an influence from length difference among the connecting wires should be considered, because the difference in lengths among the connecting wires may result in difference in resistances, such that delays may exist in signals transmitted along different connecting wires, and if the delays are too large, stability of signals will be degraded, and will even lead to failure of the signals. Therefore, in practice, it is desired that the difference in lengths among the connecting wires could be as small as possible.

In the embodiment of FIGS. 2a and 2b, the wiring has utilized the spare region, and at least one connecting wire is bent to pass through the spare region, such that the length of the connecting wire is increased, as compared with the connecting wire 41 located at the same position in FIG. 1a. In such a manner, length differences and resistance differences among the connecting wires may be reduced, so that delays of signals transmitted by different connecting wires may be reduced.

In designs in which length differences and resistance differences among the connecting wires are controlled, it is usually desired to control a maximum value of length differences or resistance differences. In other words, a length difference between the shortest connecting wire and the longest connecting wire should be small as possible. As an example, the abovementioned at least one connecting wire includes the shortest connecting wire 41'. That is, the shortest connecting wire 41' is bent and passes through the spare region. In the condition that the length of the longest connecting wire remains unchanged, the resistance difference among the connecting wires can be reduced and thereby signal delays are reduced. As an example, the spare first channel connecting pin may be located at a central position of the plurality of first channel connecting pins, which may reduce the wiring space between the two multichannel circuit connecting terminals. When the printed circuit board 100' is used in a display panel, a size of the display panel may be reduced. However, this is not necessary. For example, the spare connecting pins may also be located at positions near to either side of the first multichannel circuit connecting terminal 10.

In an example, the at least one connecting wire may also include a connecting wire adjacent to the shortest connecting wire 41', which also has a bent portion towards the shortest connecting wire. With this configuration, the spare region may be further utilized, and a length of the connecting wire adjacent to the shortest connecting wire 41' may also be correspondingly increased. For example, the length of the connecting wire adjacent to the shortest connecting wire 41' may be still between the length of the shortest connecting wire 41' and the length of the longest connecting wire.

As an example, FIG. 2c shows an exemplary basic line type for connecting wires 40' on the printed circuit board 100' according to an embodiment of the present disclosure. Compared with the example shown in FIG. 1b, the at least one connecting wire 40' additionally includes a line segment c and a line segment d. The line segment c and the line segment d are configured to allow the connecting wire 40' to bend towards the spare first channel connecting pins before extending from a connecting pin of the first multichannel circuit connecting terminal 10 to a corresponding connecting pin of the second multichannel circuit connecting terminal 20 (i.e., the first portion of the connecting wire is formed), such that the length of the connecting wire is increased and the wiring space is sufficiently utilized. It is noted that the line segment b may be directly connected with a corresponding connecting pin of the second multichannel circuit connecting terminal 20, or it may be connected with the corresponding connecting pin of the second multichannel circuit connecting terminal 20 by an additional straight segment.

To be noted, although a basic line type for the connecting wires 40' is shown in FIG. 2c, it doesn't mean that each of the connecting wires 40' on the printed circuit board 100' is composed of the line segment a, the line segment b, the line segment c and the line segment d. For example, the shortest connecting wire 41' may only include the line segment a, the line segment c and the line segment d, without the line segment b; some of the connecting wires 40' (such as connecting wires that are apart away from the shortest connecting wire 41') may only include the line segment a, the line segment b and the line segment d, without the line segment c; some of the connecting wires 40' (such as the connecting wires that are apart further away from the shortest connecting wire 41') may only include the line segment a and the line segment b, without the line segment c and the line segment d. Additionally, in a situation where there is sufficient space, each of the line segments b, c, d may be composed of bended lines or curved lines, instead of simple straight line segments. For example, at least one of the plurality of connecting wires 40' (such as the shortest connecting wire 41') may be bent several times, for example, in a bow-shaped or zig-zag wiring manner (especially the segments indicated by the line segments a and c). For example, the first portion may also include a plurality of bend portions in the spare region, such that a length of the at least one connecting wire (such as, the shortest connecting wire 41') may be further increased.

As an example, the at least one connecting wire 40' may further include: a second portion (or, it may be named as a pin connecting portion, such as the line segment a shown in FIG. 2c) and a third portion (or, it may be named as a space compressing portion, such as the line segment b shown in FIG. 2c), the second portion is connected between a corresponding first channel connecting pin 11 and the first portion, the third portion extends from the first portion towards a corresponding second channel connecting pin 21.

In an example, the plurality of connecting wires 40' are arranged symmetrically about the shortest connecting wire 41'.

In an example, the plurality of connecting wires may be arranged in a same wiring layer. With this configuration, a simple wiring structure may be achieved.

In an example, the first multichannel circuit connecting terminal 10 may be an integrated circuit connecting terminal, and the second multichannel circuit connecting terminal 20 may be a display region connecting terminal of a display panel, for example, when the printed circuit board 100' is used in the display panel. However, the present disclosure is not limited thereto. The printed circuit board 100' may be used in any electronic devices that need to be connected through multichannel circuit connecting terminals.

To be noted, although the above explanation is made by taking the shortest connecting wire 41' as an example, it doesn't mean that the shortest connecting wire 41' in all embodiments of the present disclosure should be bent and pass through the spare region. In some embodiments, for example, it may be desired to control length difference or resistance difference among the connecting wires other than the shortest connecting wire 41', and thus these connecting wires may be specifically configured to have the first portions, such that they are bent and pass through the spare region.

An embodiment of the present disclosure further provides a display panel, which includes the printed circuit board according to any one of the above embodiments.

An embodiment of the present disclosure further provides a wiring method for a printed circuit board, wherein the printed circuit board includes: a first multichannel circuit connecting terminal having a plurality of first channel connecting pins; a second multichannel circuit connecting terminal having a plurality of second channel connecting pins, the plurality of second channel connecting pins being arranged to face the plurality of first channel connecting pins, the number of the first channel connecting pins being larger than the number of the second channel connecting pins, and a length of the second multichannel circuit connecting terminal being larger than a length of the first multichannel circuit connecting terminal, the wiring method includes the following steps of:

(a) determining a spare first channel connecting pin of the plurality of first channel connecting pins, and arranging a first connecting wire to connect a first of the plurality of second channel connecting pins with a corresponding non-spare one of the first channel connecting pins, the first connecting wire being bent and passing through a region (i.e., a spare region), on the printed circuit board, between the spare first channel connecting pin and the second multichannel circuit connecting terminal; and (b) arranging other connecting wires at both sides of the first connecting wire to connect other second channel connecting pins at both sides of the first of the plurality of second channel connecting pins with other non-spare first channel connecting pins respectively.

Similar to the printed circuit board 100' according to the above described embodiment of the present disclosure, this wiring method may also be favor of improving utilization of space and adjusting length difference and resistance difference among the connecting wires.

Figure 3:
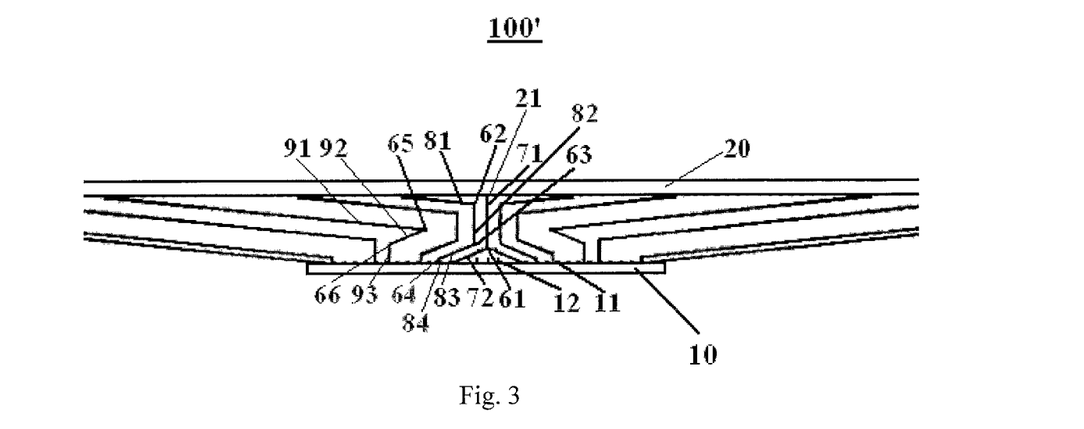

In an embodiment, the spare first channel connecting pin 12 is located at a central position of the first multichannel circuit connecting terminal 10, the first 21 of the second channel connecting pins faces the spare first channel connecting pin 12 of the first multichannel circuit connecting terminal, and the step (a) includes:

arranging the first connecting wire from a first of the second channel connecting pin 21, towards the first multichannel circuit connecting terminal in a direction perpendicular to a plane of the first multichannel circuit connecting terminal, to a first node 61 (as shown in FIG. 3), to form a first segment 71 of the first connecting wire, the first node 61 being located between the first of the second channel connecting pin and the spare first channel connecting pin 12; and arranging a connecting wire from the first node 61 to the corresponding non-spare one of the first channel connecting pins to form a second segment 72 of the first connecting wire, wherein a direction of the second segment 72 is not parallel to or does not coincide with the direction of the first segment 71. In other words, the direction of the first segment 71 and the direction of second segment 72 of the first connecting wire intersect with each other. In the example shown in FIG. 3, the first segment 71 of the first connecting wire extends in the vertical direction, while the second segment 72 of the first connecting wire extends in an inclined direction. However, the present disclosure is not limited thereto, directions of the first segment 71 and the second segment 72 of the first connecting wire may be set as required.

In an example, in the wiring method for printed circuit board, the step (b) may include:

arranging a second connecting wire, from a second of the second channel connecting pins adjacent to and at a first side (left side in FIG. 3) of the first 21 of the second channel connecting pins towards the first segment 71 of the first connecting wire, to a second node 62 to form a first segment 81 of the second connecting wire, the second node 62 being located between the second of the second channel connecting pins and the first segment 71 of the first connecting wire;

arranging a second segment 82 of the second connecting wire from the second node 62 in a direction in parallel with the first segment 71 of the first connecting wire to a third node 63, the third node 63 being located between the second node 62 and the first multichannel circuit connecting terminal 10;

arranging a third segment 83 of the second connecting wire, from the third node 63 to a fourth node 64, the fourth node 64 being located between the first multichannel circuit connecting terminal 10 and the second multichannel circuit connecting terminal 20 and at a position aligned with another first channel connecting pin at the first side (FIG. left side in the figure) of the non-spare first channel connecting pin 11 (as an example, as shown in FIG. 3, the fourth node 64 is located right above the another first channel connecting pin) and being closer to the first multichannel circuit connecting terminal 10 than the third node 63; and arranging a fourth segment 84 of the second connecting wire from the fourth node 64 to the another first channel connecting pin.

It can be understood from the above example that the position of the first node 61 directly affects inclination degree of the second segment 72 of the first connecting wire, inclination degree of the third segment 83 of the second connecting wire and the position of the second node 62. As an example, the position of the first node 61 may be determined based on requirement in terms of an overall resistance.

In another example, the step (b) may further include:

arranging a third connecting wire, from a third of the second channel connecting pins at an outer side of the second of the second channel connecting pins towards the second segment 82 of the second connecting wire, to a fifth node 65 to form a first segment 91 of the third connecting wire, the fifth node 65 being located between the third of the second channel connecting pins and the second segment 82 of the second connecting wire;

arranging a second segment 92 of the third connecting wire from the fifth node 65 to a sixth node 66, the sixth node 66 being located between the first multichannel circuit connecting terminal 10 and the second multichannel circuit connecting terminal 20 and at a position aligned with a further first channel connecting pin at an outer side (the left side of the figure) of the another first channel connecting pin (as an example, the sixth node 66 is located directly above the further first channel connecting pin, as shown in FIG. 3) and being closer to the first multichannel circuit connecting terminal 10 than the fifth node 65 (as an example, the fifth node 65 is located above the sixth node 66, as shown in FIG. 3); and arranging a third segment 93 of the third connecting wire from the sixth node 66 to the further first channel connecting pin.

As an example, a plurality of the second connecting wires (i.e., the connecting wire formed by connecting four line segments successively, as shown in FIG. 2c) may be provided between the first connecting wire and the third connecting wire, and lengths of the second segments 82 of the plurality of second connecting wires gradually decrease along a direction from the first connecting wire to the third connecting wire, as shown in FIGS. 2a and 3. In such a manner, wiring space may be more sufficiently utilized.

The above described wiring method may be favor of a sufficient utilization of the wiring space and control of the resistance difference among the connecting wires.

As shown in FIGS. 2a and 3, besides of the connecting wires in the forms of the first connecting wire, the second connecting wire and the third connecting wire described in the above embodiments, some connecting wires in two-segment form shown in FIG. 1b and even in one-segment form (i.e., the connecting wire shown in FIG. 1b excluding the line segment a) may be provided at positions close to outer side of the first multichannel circuit connecting terminal 10. Wiring method of these connecting wires are similar to that of the third connecting wire but even much simpler, thus, a detailed description thereof is omitted herein.

Although the method of wiring the connecting wires has been described by taking the first side (i.e., the left side of FIG. 2a and FIG. 3) as an example, it is appreciated that, at the other side (i.e., the right side of FIG. 2a and FIG. 3) of the first connecting wire, similar second connecting wire and third connecting wire may be provided. As an example, in a printed circuit board according to an embodiment of the present disclosure, two or more two-segment form first connecting wires (i.e., connecting wires having the first segment 71 and the second segment 72) may be provided.

In an example, the first connecting wire is the shortest connecting wire among all the connecting wires.

In an example, the first of the second channel connecting pins faces the central position of the first multichannel circuit connecting terminal, which may facilitate reducing wiring space between the two multichannel circuit connecting terminals.

As an example, connecting wires adjacent to the first connecting wire may be bent towards the first connecting wire, which may be favor of reducing the spare region between the two multichannel circuit connecting terminals as much as possible to reduce an overall space needed for the wiring.

In an example, all connecting wires are arranged symmetrically about the first connecting wire.

In an example, the first connecting wire is bent several times. For example, the first connecting wire is bent several times in the spare region. This may further increase the length of the shortest connecting wire, so as to decrease the differences in resistance among the connecting wires.

In an example, all connecting wires are arranged in the same wiring layer. With this configuration, a simplified wiring structure may be easy achieved.

Although the present disclosure has been described in conjunction with the drawings, the embodiments shown in the drawings should not be interpreted as a limitation to the present disclosure, rather, they are provided to illustratively show preferable implementations of the present disclosure. Term "a" or "an" before an element doesn't mean that there cannot be a plurality of such elements. Terms "first", "second", "third" and the like doesn't imply any sequence or order and doesn't exclude the existence of a plurality of such elements, these terms may be regarded as a part of the name of the element.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A printed circuit board, comprising:
a first multichannel circuit connecting terminal having a plurality of first channel connecting pins;
a second multichannel circuit connecting terminal having a plurality of second channel connecting pins, the plurality of second channel connecting pins being arranged to face the plurality of first channel connecting pins, the number of the first channel connecting pins being larger than the number of the second channel connecting pins and a length of the second multichannel circuit connecting terminal being larger than a length of the first multichannel circuit connecting terminal; and
a plurality of connecting wires arranged between the first multichannel circuit connecting terminal and the second multichannel circuit connecting terminal, the plurality of connecting wires connecting the plurality of second channel connecting pins with a part of the first channel connecting pins in one-to-one correspondence, with the rest of the first channel connecting pins being spare,
wherein at least one of the plurality of connecting wires has a first portion, which is bent to extend through a spare region, on the printed circuit board, between the spare first channel connecting pins and the second multichannel circuit connecting terminal.

2. The printed circuit board according to claim 1, wherein the spare first channel connecting pins are located at a central position of the plurality of first channel connecting pins.

3. The printed circuit board according to claim 1, wherein the at least one of the connecting wires comprises a shortest connecting wire.

4. The printed circuit board according to claim 3, wherein the at least one of the connecting wires further comprises a connecting wire located adjacent to the shortest connecting wire and having a first portion bent towards the shortest connecting wire.

5. The printed circuit board according to claim 3, wherein the plurality of connecting wires are arranged symmetrically about the shortest connecting wire.

6. The printed circuit board according to claim 1, wherein the first portion comprises a plurality of bend portions in the spare region.

7. The printed circuit board according to claim 6, wherein the first portion is arranged in a bow-shaped manner or a zig-zag manner in the spare region.

8. The printed circuit board according to claim 1, wherein the plurality of connecting wires are arranged in a same wiring layer.

9. The printed circuit board according to claim 1, wherein the at least one of the connecting wires further comprises:

a second portion connected between a corresponding one of the first channel connecting pins and the first portion; and a third portion extending from the first portion towards a corresponding one of the second channel connecting pins.

10. The printed circuit board according to claim 1, wherein the first multichannel circuit connecting terminal is an integrated circuit connecting terminal, and the second multichannel circuit connecting terminal is a display region connecting terminal of a display panel.

11. A display panel, comprising the printed circuit board according to claim 1.

12. A wiring method for a printed circuit board, the printed circuit board comprising a first multichannel circuit connecting terminal having a plurality of first channel connecting pins and a second multichannel circuit connecting terminal having a plurality of second channel connecting pins, the plurality of second channel connecting pins being arranged to face the plurality of first channel connecting pins, the number of the first channel connecting pins being larger than the number of the second channel connecting pins, and a length of the second multichannel circuit connecting terminal being larger than a length of the first multichannel circuit connecting terminal, the wiring method comprising the following steps of:

(a) determining a spare first channel connecting pin of the plurality of first channel connecting pins and arranging a first connecting wire to connect a first one of the plurality of second channel connecting pins with a corresponding non-spare one of the first channel connecting pins, the first connecting wire being bent to pass through a spare region, on the printed circuit board, between the spare first channel connecting pin and the second multichannel circuit connecting terminal; and (b) arranging other connecting wires at both sides of the first connecting wire to connect other second channel connecting pins at both sides of the first one of the plurality of second channel connecting pins with other non-spare first channel connecting pins respectively.

13. The wiring method according to claim 12, wherein the spare first channel connecting pin is located at a central position of the first multichannel circuit connecting terminal, the first one of the second channel connecting pins faces the spare first channel connecting pin of the first multichannel circuit connecting terminal, and wherein the step (a) comprises:

arranging a first segment of the first connecting wire from the first one of the second channel connecting pin towards the first multichannel circuit connecting terminal in a direction perpendicular to a plane of the first multichannel circuit connecting terminal to a first node, the first node being located between the first one of the second channel connecting pins and the spare first channel connecting pin; and arranging a second segment of the connecting wire from the first node to the non-spare first channel connecting pins, wherein an extending direction of the second segment is not parallel to or does not coincide with an extending direction of the first segment.

14. The wiring method according to claim 13, wherein the step (b) comprises:

arranging a first segment of a second connecting wire such that it extends from an adjacent second one of the second channel connecting pins located at a first side of the first one of the second channel connecting pins towards the first segment of the first connecting wire to a second node, the second node being located between the second one of the second channel connecting pins and the first segment of the first connecting wire;

arranging a second segment of the second connecting wire such that it extends from the second node in a direction in parallel with the first segment of the first connecting wire to a third node, the third node being located between the second node and the first multichannel circuit connecting terminal;

arranging a third segment of the second connecting wire such that it extends from the third node to a fourth node, the fourth node being located between the first multichannel circuit connecting terminal and the second multichannel circuit connecting terminal, at a position directly facing another first channel connecting pin at the first side of the non-spare first channel connecting pin and being closer to the first multichannel circuit connecting terminal than the third node; and arranging a fourth segment of the second connecting wire such that it extends from the fourth node to the another first channel connecting pin.

15. The wiring method according to claim 14, wherein the step (b) further comprises:

arranging a first segment of a third connecting wire such that it extends from a third one of the second channel connecting pins located at an outer side of the second one of the second channel connecting pins towards the second segment of the second connecting wire to a fifth node, the fifth node being located between the third one of the second channel connecting pins and the second segment of the second connecting wire;

arranging a second segment of the third connecting wire such that it extends from the fifth node to a sixth node, the sixth node being located between the first multichannel circuit connecting terminal and the second multichannel circuit connecting terminal, at a position directly facing a further first channel connecting pin at an outer side of the another first channel connecting pin and being closer to the first multichannel circuit connecting terminal than the fifth node; and arranging a third segment of the third connecting wire such that it extends from the sixth node to the further first channel connecting pin.

16. The wiring method according to claim 15, wherein a plurality of the second connecting wires are arranged between the first connecting wire and the third connecting wire, and lengths of the second segments of the plurality of second connecting wires gradually decrease along a direction from the first connecting wire towards the third connecting wire.

17. The wiring method according to claim 12, wherein a connecting wire located adjacent to the first connecting wire is bent towards the first connecting wire.

18. The wiring method according to claim 12, wherein all the connecting wires are arranged symmetrically about the first connecting wire.

19. The wiring method according to claim 12, wherein the first connecting wire is bent several times in the spare region.

20. The wiring method according to claim 12, wherein all the connecting wires are arranged in a same wiring layer.

\* \* \* \* \*